United States Patent
Blanckaert et al.

(10) Patent No.: US 11,860,486 B2
(45) Date of Patent: Jan. 2, 2024

(54) DIGITAL DISPLAY DEVICE COMPRISING TWO SUPERIMPOSED DISPLAY CELLS AND TIMEPIECE COMPRISING SUCH A DISPLAY DEVICE

(71) Applicant: The Swatch Group Research and Development Ltd, Marin (CH)

(72) Inventors: Nicolas Blanckaert, Boudry (CH); Jerome Thiault, Colombier (CH); Michel Sagardoyburu, Neuchatel (CH); Cecile Barron, Corcelles (CH)

(73) Assignee: The Swatch Group Research and Development Ltd, Marin (CH)

( * ) Notice: Subject to any disclaimer, the term of this patent is extended or adjusted under 35 U.S.C. 154(b) by 86 days.

(21) Appl. No.: 16/986,341

(22) Filed: Aug. 6, 2020

(65) Prior Publication Data

US 2021/0181571 A1 Jun. 17, 2021

(30) Foreign Application Priority Data

Dec. 13, 2019 (EP) ..................................... 19215910

(51) Int. Cl.
*G02F 1/1343* (2006.01)
*G02F 1/1335* (2006.01)
(Continued)

(52) U.S. Cl.
CPC .. *G02F 1/134327* (2013.01); *G02F 1/133514* (2013.01); *G02F 1/133528* (2013.01);
(Continued)

(58) Field of Classification Search
CPC ......... G02F 1/134327; G02F 1/133555; G02F 1/133514; G02F 2201/44; G09G 3/04;
(Continued)

(56) References Cited

U.S. PATENT DOCUMENTS 5,121,234 A * 6/1992 Kucera ............. G02F 1/134327
349/69
5,559,528 A * 9/1996 Ravid ..................... G09F 9/302
345/618
(Continued)

FOREIGN PATENT DOCUMENTS

CH 710 226 A2 4/2016
CN 1202644 A 12/1998
(Continued)

OTHER PUBLICATIONS

Combined Chinese Office Action and Search Report dated Nov. 1, 2021 in Chinese Patent Application No. 202011461757.2 (with English translation), 15 pages.
European Search Report dated May 6, 2020 in European Application 19215910.1 filed Dec. 13, 2019 (with English Translation of Categories of Cited Documents), 3 pages.
Second Chinese Office Action dated Jun. 6, 2022 in Chinese Patent Application No. 202211461757.2, 12 pages(with English Translation).

*Primary Examiner* — Paisley L Wilson
(74) *Attorney, Agent, or Firm* — Oblon, McClelland, Maier & Neustadt, L.L.P.

(57) ABSTRACT

A digital display device including, from top to bottom, a first red filter, a transflective liquid crystal display cell, a second red filter and an emissive display cell, the transflective liquid crystal display cell displaying information using at least one first seven-segment digit and the emissive display cell providing a plurality of juxtaposed light points which are arranged so as to provide a display formed by at least one second seven-segment digit.

13 Claims, 1 Drawing Sheet

(51) Int. Cl.
*G04G 9/00* (2006.01)
*G04G 9/06* (2006.01)
*G04G 9/12* (2006.01)
*G04G 17/04* (2006.01)
*G09G 3/20* (2006.01)
*G09G 3/18* (2006.01)
*G09G 3/14* (2006.01)
*G04G 9/10* (2006.01)
*H10K 59/38* (2023.01)
*H10K 59/50* (2023.01)
*G02F 1/133* (2006.01)

(52) U.S. Cl.
CPC ..... *G02F 1/133555* (2013.01); *G04G 9/0094* (2013.01); *G04G 9/06* (2013.01); *G04G 9/10* (2013.01); *G04G 9/12* (2013.01); *G04G 17/045* (2013.01); *G09G 3/14* (2013.01); *G09G 3/18* (2013.01); *G09G 3/2003* (2013.01); *H10K 59/38* (2023.02); *H10K 59/50* (2023.02); *G02F 1/13312* (2021.01); *G02F 1/133618* (2021.01); *G02F 2201/44* (2013.01); *G04G 9/107* (2013.01); *G04G 9/126* (2013.01); *G09G 2300/023* (2013.01)

(58) Field of Classification Search
CPC ...... G09G 3/14; G09G 3/18; G09G 2300/023; H01L 27/3232
See application file for complete search history.

(56) References Cited

U.S. PATENT DOCUMENTS

| | | | |
|---|---|---|---|
| 6,292,439 | B1 | 9/2001 | Akiba et al. |
| 8,957,863 | B2* | 2/2015 | Polak ................... G06F 3/0219 |
| | | | 349/97 |
| 2002/0071347 | A1* | 6/2002 | Gilomen ............... G04G 9/0082 |
| | | | 368/82 |
| 2002/0085155 | A1* | 7/2002 | Arikawa ........... G02F 1/133509 |
| | | | 349/129 |
| 2016/0004137 | A1 | 1/2016 | Sagardoyburu |
| 2016/0104410 | A1 | 4/2016 | Sagardoyburu |
| 2016/0218156 | A1* | 7/2016 | Shedletsky ......... H01L 51/5012 |
| 2018/0005567 | A1* | 1/2018 | Takahashi ............ G09G 3/2092 |
| 2021/0385360 | A1* | 12/2021 | Wang ....................... G09F 9/30 |

FOREIGN PATENT DOCUMENTS

| | | |
|---|---|---|
| CN | 1236443 A | 11/1999 |
| CN | 1764829 A | 4/2006 |
| CN | 1011004505 A | 7/2007 |
| CN | 104280928 A | 1/2015 |
| CN | 104615397 A | 5/2015 |
| CN | 105321434 A | 2/2016 |
| CN | 208334845 U | 1/2019 |
| EP | 2 963 505 A1 | 1/2016 |
| EP | 3 006 994 A1 | 4/2016 |

* cited by examiner

DIGITAL DISPLAY DEVICE COMPRISING TWO SUPERIMPOSED DISPLAY CELLS AND TIMEPIECE COMPRISING SUCH A DISPLAY DEVICE

CROSS-REFERENCE TO RELATED APPLICATION

This application claims priority to European Patent Application No. 19215910.1 filed on Dec. 13, 2019, the entire disclosure of which is hereby incorporated herein by reference.

TECHNICAL FIELD OF THE INVENTION

The present invention relates to a digital display device comprising two superimposed display cells. More specifically, the present invention relates to a digital display device comprising in combination a transflective liquid crystal display cell and an emissive display cell. The present invention also relates to a timepiece, particularly a wristwatch, equipped with a digital display device of the kind mentioned above.

TECHNOLOGICAL BACKGROUND OF THE INVENTION

The object of the present invention is particularly to meet the demand of some nostalgic customers for the first electronic watches which appeared on the market in the early 1970s, by providing them with an electronic watch produced according to the current standards but having the visual appearance of these first electronic watches.

The first electronic watches used a digital display device whose segments were formed by Light Emitting Diodes or LED. These digital display devices being of the emissive type, their power consumption was far too high so that they can be kept switched-on permanently. This is why their switching-on was done upon demand of the wearer of the watch, by pressing a push button, which allowed to fleetingly show the current time, the date, the passage of the seconds, or even the day of the week. The LEDs used emitted a red colour because, at that time, they were the only ones whose making was known.

The segments that composed the digital display devices of the first electronic watches were elongated in shape and combined together several light emission points on the same silicon substrate. Such a solution was expensive due to the used silicon surface and is no longer commercially available these days. Moreover, using commercially available LEDs these days is also complicated because the packaging of these small LEDs is too voluminous for the emission light points formed by these LEDs to be as close to each other as on the original watch.

There was therefore a high demand on the market for an electronic watch whose appearance is the same as that of the first electronic watches marketed from the early 1970s, but which is designed by means of components available these days.

SUMMARY OF THE INVENTION

The present invention has the purpose of meeting this demand as well as others also by providing a digital display device for a timepiece, this digital display device being produced with the technical means available these days and therefore being more reliable and more economic, but having the visual appearance of the display devices that equipped the first electronic watches appeared in the early 1970s.

To this end, the present invention relates to a digital display device comprising, from top to bottom, a first red filter, a transflective liquid crystal display cell, a second red filter and an emissive display cell, the liquid crystal display cell displaying information by means of at least one first seven-segment digit, and the emissive display cell comprising a plurality of juxtaposed light points which are arranged so as to display at least one second seven-segment digit.

According to particular embodiments of the invention:
the transflective liquid crystal display cell is a twisted nematic liquid crystal display cell, also known as Twisted Nematic Liquid Crystal Display Device or TN cell, with which are associated a linear polariser disposed above the twisted nematic liquid crystal display cell and a transflective polariser disposed below the nematic liquid crystal display cell;
the emissive display cell is an organic light-emitting diode display cell which emits red light;
the digital display device comprises, from top to bottom and in this order:
the first red filter;
a linear polariser;
the twisted nematic liquid crystal display cell;
a transflective polariser;
the second red filter;
the organic light-emitting diode display cell;
the digital display device comprises, from top to bottom and in this order:
a linear polariser;
the first red filter;
the twisted nematic liquid crystal display cell;
a transflective polariser;
the second red filter;
the organic light-emitting diode display cell;
a light sensor, placed under the emissive display cell, measures the intensity of the ambient illumination, this measurement of the intensity of the ambient illumination being used to accommodate the luminosity of the emissive display cell depending on the ambient illumination conditions.

Thanks to these features, the present invention provides a digital display device allowing to reproduce the appearance of the first digital display devices that appeared in the early 1970s, with the means available these days. These first digital displays were distinguished in particular by their red colour which was explained by the fact that at that time, only light-emitting diodes of this colour were available, and by the shape of the displayed characters which were presented in the shape of seven-segment digits. By proposing such a digital display device, the present invention in particular has the purpose of not only meeting the demand of the nostalgic watch lovers of the first electronic watches who can no longer find on the second hand market original watches of this type in working condition, and providing to these watch lovers new timepieces which have the same appearance as old timepieces, but whose operation is much more reliable thanks to the use of modern components, but also improving the user experience by providing a digital display device displaying information permanently.

To achieve this purpose, the present invention teaches to combine a transflective liquid crystal display cell which allows to read information it displays in good conditions when the wearer of the wristwatch has a good ambient illumination provided by the sun or by an artificial lighting, with an emissive display cell which will display the information in a readable manner when the wearer of the wristwatch is in dim light or darkness. To perfect the resemblance of the digital display device according to the invention with the first marketed digital display devices, the characters displayed by the transflective liquid crystal display cell are formed by seven-segment digits. Similarly, the light emission points provided by the emissive display cell are arranged so as to form seven-segment digits. Finally, a first red filter is disposed above the transflective liquid crystal display cell in order to provide the characters displayed by the transflective liquid crystal display cell with the red colour characteristic of the first marketed digital display devices. As for the emissive display cell, it is designed so that its light emission points emit red light and may further be combined with a second red filter to precisely adjust the appearance of the red light it emits to the red colour that is sought.

Thanks to these dispositions, a digital display device is obtained, which is formed by a transflective liquid crystal display cell and an emissive display cell, both of which are capable of displaying information in the red part of the visible light spectrum. When the wearer of the watch is in good ambient illumination conditions (natural or artificial light), he can read information provided to him by the transflective liquid crystal display cell. Conversely, when the wearer of the watch is in dim light or darkness, he will just need to actuate a push button to control the switching-off of the transflective liquid crystal display cell and the switching-on of the emissive display cell. Thus, even in low-light or no-light conditions, the wearer of the watch will be able to read information displayed by the digital display device according to the invention under optimal conditions.

Upon reading the foregoing, it will be understood that, besides the fact that the digital display device according to the invention is more reliable and has a much more advantageous cost price than the first digital display devices appeared on the markets in the early 1970s, the digital display device according to the invention is also much more energy efficient than its distant ancestors.

Indeed, in the case of the first digital display devices, the latter had only two distinct states: a first switched-off state wherein they were most of the time and wherein they did not provide any information, and a second switched-on state wherein they fleetingly displayed an information after the wearer of the watch presses on a push button. On the contrary, in the case of the digital display device according to the invention, the transflective liquid crystal display cell permanently displays an information while not detracting from the autonomy of this digital display device.

This is made possible by the fact that the electric consumption of such a transflective liquid crystal display cell is very low and therefore does not negatively affect the electrical energy reserves of the wristwatch wherein it is mounted. Consequently, by default, the wearer of the wristwatch constantly has the information displayed by the transflective liquid crystal display cell. If he is in ambient illumination conditions which allow it, the wearer can therefore read this information. On the contrary, if the wearer of the wristwatch is in dim light or darkness, he will activate the emissive display cell, which will allow him, in this case too, to read the information displayed by the digital display device according to the invention in good conditions. Consequently, while the first digital display devices put on the market could switch only between a state where they were blind and a state where they displayed an information in a very fleeting manner, the digital display device according to the invention can be switched between a default state wherein it constantly displays an information by means of its transflective liquid crystal display cell, and a state wherein this information is displayed by the emissive display cell. Consequently, thanks to these features, the digital display device according to the invention provides the desired information to the wearer of the watch permanently and not only fleetingly after the wearer of the watch presses on a push button.

Furthermore, whether the information is displayed by the transflective liquid crystal display cell or by the emissive display cell, said information has the same red colour and is arranged in the manner of digits formed by seven segments.

Finally, according to another particular embodiment of the invention, the present digital display device is equipped with a light sensor, preferably disposed under the emissive display cell, this light sensor having the function of measuring the intensity of ambient illumination, a measurement which is then used to adapt the luminosity of the emissive display cell according to the conditions of ambient illumination. Thus, when the intensity of the ambient illumination is low, the intensity of the display provided by the emissive display cell will be deliberately kept low so as not to dazzle the wearer of the watch when he presses the push button to consult his watch and, conversely, when the measurement performed by the light sensor indicates a high ambient illumination level, the intensity of the light provided by the emissive display cell will be increased in order to guarantee the readability of information provided by the latter.

Thanks to these features, the present invention provides a digital display device allowing, with the means available these days, to reproduce the appearance of the first digital display devices that appeared in the early 1970s. Compared to their predecessors, the display devices according to the invention are more reliable and their electric consumption is lower while they are capable of displaying information permanently, whereas the digital display devices of the prior art displayed the information only fleetingly, upon demand of the wearer of the watch.

BRIEF DESCRIPTION OF THE FIGURES

Other features and advantages of the present invention will emerge more clearly from the detailed description which follows of an example of a digital display device according to the invention, this example being given in a purely illustrative and non-limiting manner only in relation with the appended drawing on which.

DETAILED DESCRIPTION OF AN EMBODIMENT OF THE INVENTION

The present invention proceeds from the general inventive idea which consists in providing a digital display device which, with the technical means currently available, allows to reproduce the appearance and the operating mode of the first digital display devices appeared in Japan in the early 1970s. This digital display device which consists of a transflective liquid crystal display cell disposed above an emissive display cell is more reliable and more economic than the first digital display devices and further allows to permanently display useful information while achieving substantial gains in terms of power consumption. The present invention also relates to a timepiece, particularly a wristwatch, equipped with the present digital display device.

Figure 1:
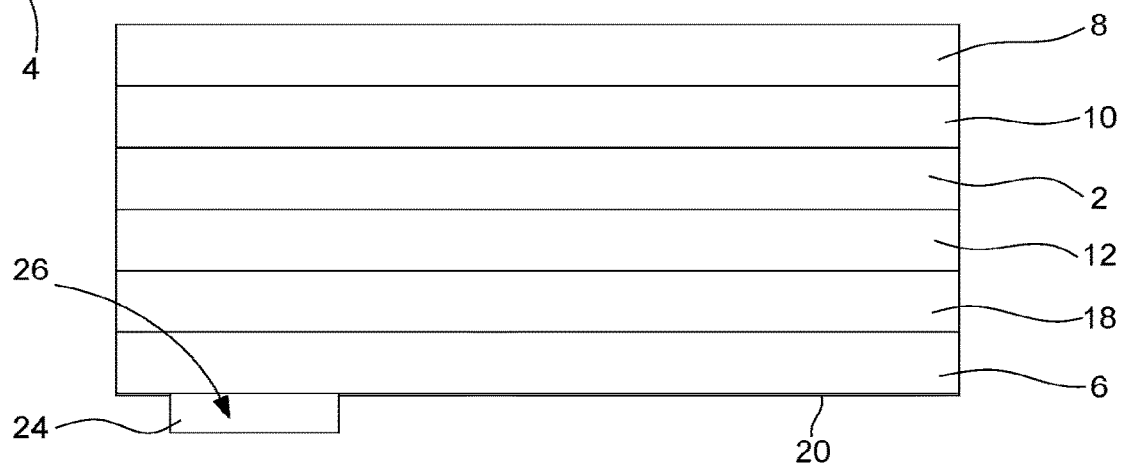
FIG. 1 is a sectional schematic view of a digital display device in accordance with the invention comprising a transflective liquid crystal display cell disposed above an emissive display cell, with a first red filter disposed above the transflective liquid crystal display cell and a second red filter disposed between the transflective liquid crystal display cell and the emissive display cell.
Figure 2:
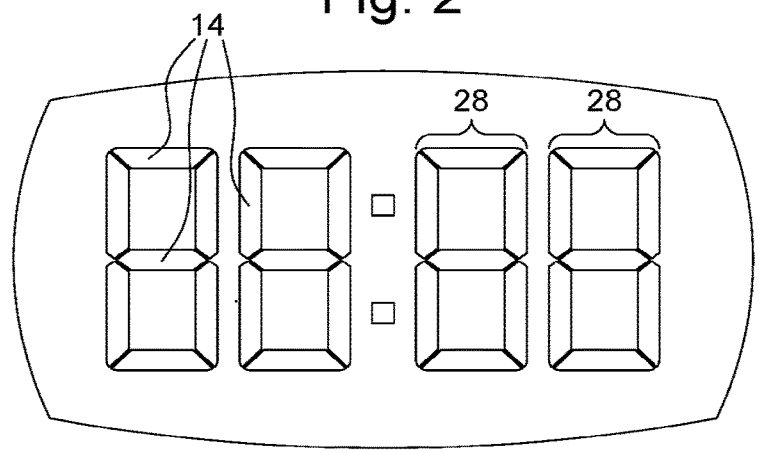
FIG. 2 is a schematic view which illustrates the arrangement of information display segments of the transflective liquid crystal display cell in the shape of seven-segment digits.

FIG. 1 is a sectional schematic view of a digital display device according to the invention. Designated as a whole by the general numerical reference 1, this digital display device comprises a transflective liquid crystal display cell 2 disposed, relative to an observer 4, above an emissive display cell 6.

The digital display device 1 is completed by a first red filter 8 which, disposed above the transflective liquid crystal display cell 2, on the side through which the ambient light penetrates into this digital display device 1, allows to impart to the information displayed by this transflective liquid crystal display cell 2 a red colour similar to that in which were displayed the information provided by the first digital display devices appeared on the market in the early 1970s.

As a preferred but non-limiting example, the transflective liquid crystal display cell 2 is of the Twisted Nematic or TN cell type. For its proper operation, such a twisted nematic liquid crystal display cell conventionally requires a linear polariser 10 and a transflective polariser 12. The linear polariser 10 is disposed above the TN liquid crystal display cell, that is to say on the side through which the ambient light penetrates into the latter, while the transflective polariser 12 is disposed under this TN liquid crystal display cell. As it will be better understood upon reading what follows, the TN liquid crystal display cell displays the information by means of electrodes shaped into segments 14 which are arranged so as to form seven-segment digits.

With regard to the emissive display cell 6, preferably, but in a non-limiting manner, it is an Organic Light Emitting Diode display cell, these diodes being also known as OLED. For the display of information, such an OLED display cell provides a plurality of juxtaposed light points 16.

The digital display device 1 finally comprises a second red filter 18 disposed between the transflective polariser 12 and the OLED display cell. Adding this second red filter 18 has a double advantage: firstly, it allows, if necessary, to correct the emission spectrum of the light provided by the OLED display cell in order to obtain the desired colour, red in this case; then, it allows the information displayed by the digital display device 1 according to the invention to stand out against a black back, while avoiding having to resort to complex, costly and bulky solutions involving circular polarisers or other optical components.

In the example shown in FIG. 1, the first red filter 8 and the linear polariser 10 are disposed in this order above the transflective liquid crystal display cell 2. It will however be noted that according to a particular embodiment of the invention, this order can be reversed, the first red filter 8 being disposed between the linear polariser 10 and the transflective liquid crystal display cell 2. This first red filter 8 can also be disposed between the transflective liquid crystal display cell 2 and the transflective polariser 12. The first red filter 8 allows to impart a red colour to the information displayed by the transflective liquid crystal display cell 2. This first red filter 8 can be produced by means of a film which is mass-tinted in red or by means of a transparent film coated with a layer of red ink on at least one of its two faces. This first red filter 8 can further be formed by a red polariser.

The linear polariser 10, necessary for the operation of the TN liquid crystal display cell, also determines the negative (clear on a dark back) or positive (dark on a light back) contrast with which the information provided by this TN liquid crystal display cell is displayed. In the present case, the linear polariser 10 is oriented so that the TN liquid crystal display cell is of the negative contrast type and the information it displays appear in red on a black back.

The TN liquid crystal display cell comprises in particular two substrates which extend parallel to and at a distance from each other and which are joined together by a sealing frame, so as to delimit a sealed enclosure for the confinement of the twisted nematic liquid crystal. These substrates are thin, typically of the order of a few tenths of a millimetre, in order to limit the parallax phenomenon, which allows to improve the reflectivity of the TN liquid crystal display cell and the readability of the information displayed by the latter.

When the transflective liquid crystal display cell 2 is activated and it displays information, the transflective polariser 12 disposed under the transflective liquid crystal display cell 2 returns the ambient light which penetrates from above into the digital display device 1 and allows the observer 4 to read these information. When the transflective liquid crystal display cell 2 is in the passive state, it displays no information and passes the light produced by the emissive display cell 6. At this time, the transflective liquid crystal display cell 2 is transparent.

The application of an electric field between an electrode and a corresponding counter-electrode (not visible in the drawing), allows the TN liquid crystal display cell to display information. These electrodes are structured in segments 14 arranged so as to form first seven-segment digits 20. Combined with the first red filter 8, these seven-segment digits 20 allow identically reproducing the appearance of the information as displayed by the first digital display devices appeared in the early 1970s. The TN liquid crystal display cell used in the context of the present invention is nevertheless superior to the digital display device with red light-emitting diodes used in the first digital watches: indeed, while these first digital LED display devices were large electric power consumers and could therefore only be activated punctually, when the wearer of the watch wanted to check the time, the TN liquid crystal display cells consume very little electric current and can therefore be kept permanently activated.

Figure 3:
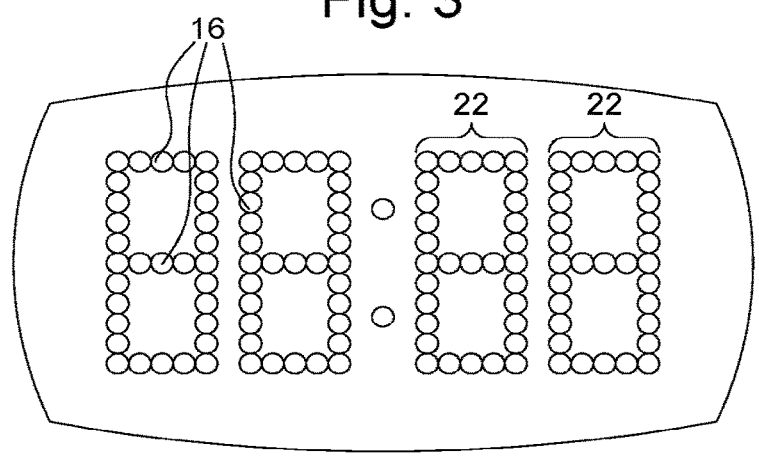
FIG. 3 is a schematic view which illustrates the arrangement, in the shape of seven-segment digits, of the light emission points provided by the emissive display cell.

With regard to the OLED display cell, this one provides (see FIG. 3) a plurality of light points 16 which are juxtaposed so as to form second seven-segment digits 22 which are each formed for example by five light points 16. According to the invention, the transflective liquid crystal display cell 2 provides information permanently. However, when the ambient illumination conditions are not sufficient to allow the wearer of the watch to read the information provided by the transflective liquid crystal display cell 2, the wearer of the watch can press a push button, which causes the stoppage of the transflective liquid crystal display cell 2, and the momentary switching-on of the emissive display cell 6. After a period of time during which the emissive display cell 6 is switched-on and the wearer of the watch can read the information displayed by this emissive display cell 6, the latter is switched off again and the transflective liquid crystal display cell 2 is activated again. It should be noted that thanks to the techniques used to manufacture the OLED display cells, it is possible to create light points in an extremely precise and homogeneous manner. Indeed, summed up very succinctly, an OLED display cell comprises a series of organic thin films sandwiched between two electrically conductive thin film electrodes (anode and cathode). When an electric current is applied to an OLED display cell, an electric field is created under the effect of which the charge carriers, electrons and holes, migrate from the electrodes in the organic thin films until they recombine by forming excitons, that is to say electron-hole pairs linked by the Coulomb forces. Once formed, these excitons, or excited states, relax to a lower energy level by emitting photons. By selectively depositing a transparent and electrically insulating passivation layer between the anode and the cathode, it is possible to very finely structure the surfaces through which the OLED display cell emits light.

According to a preferred but non-limiting embodiment of the invention, the digital display device 1 is equipped with a light sensor 24 in order to adjust the intensity of the OLED display cell according to conditions of ambient illumination. More specifically, provision is made to further reduce the intensity of the light produced by the OLED display cell as the ambient illumination is low. This is particularly advantageous for a user who wants to consult his watch during the night and who will not be dazzled by a too strong light intensity produced by the OLED display cell. To this end, the light sensor 24 is placed under the emissive display cell 6, in other words under the OLED display cell, and an aperture 26 is formed in the cathode 28 of the latter so that the ambient light which penetrates from above in the digital display device 1 according to the invention can reach the light sensor 24. Indeed, the cathode 28 being metallic, it is completely opaque.

Finally, from an electronic point of view, each of the two display cells 2 and 6 has its own driver. A microcontroller manages the two drivers independently of each other according to the choice of the user who pressed or not on the push button of the watch to activate the emissive display cell and the signal representative of the degree of ambient illumination sent by the light sensor.

It goes without saying that the present invention is not limited to the embodiments which have just been described and that various modifications and simple variants can be considered by the person skilled in the art without departing from the scope of the invention as defined by the appended claims. It is in particular understood that the present digital display device 1 according to the invention is intended to be installed in a timepiece, particularly a wristwatch. It will also be noted that, in the present description, when it is mentioned that a first component, for example the first red filter, is disposed above a second component, for example the transflective liquid crystal display cell, this only specifies the order in which these first and second components follow one another from the top to the bottom of the stack of components which constitute the digital display device according to the invention, but does not in any way mean that the second component immediately follows the first component in this stack; it is quite possible that one or more additional components are disposed between the first and the second component. It will also be understood that activated transflective liquid crystal display cell means that an electric field is applied between electrode and counter electrode of this transflective liquid crystal display cell, which allows the latter to display the information. Conversely, when the transflective liquid crystal display cell is said to be in the passive or inactive state, this means that no electric field is applied between the electrode and counter electrode of this transflective liquid crystal display cell and that it therefore does not display any information. Finally, it will be noted that transflective polariser means a polariser which behaves in a transflective manner when the crystal cell is activated and displays information, and which is transparent with respect to the light emitted by the OLED display cell when this one is activated. Consequently, this transflective polariser imparts to the liquid crystal display cell also a transflective behaviour: when this liquid crystal display cell is activated and it displays information, it behaves in a transflective manner with respect to the ambient light which penetrates into the digital display device, and when the liquid crystal display cell is inactivated, that is to say when it displays no information, it is transparent to the light produced by the OLED display cell which is activated.

NOMENCLATURE

1. Digital display device
2. Transflective liquid crystal display cell
4. Observer
6. Emissive display cell
8. First red filter
10. Linear polariser
12. Transflective polariser
14. Segments
16. Light points
18. Second red filter
20. First seven-segment digit
22. Second seven-segment digit
24. Light sensor
26. Aperture
28. Cathode

The invention claimed is:

1. A digital display device comprising, from top to bottom, a first red filter, a transflective liquid crystal display cell, a second red filter, and an emissive display cell,
   wherein the transflective liquid crystal display cell displays information with at least one first seven-segment digit and
   wherein the emissive display cell comprises a plurality of juxtaposed light points which are arranged so as to display at least one second seven-segment digit, with two or more of the light points being positioned in each segment of the second seven-segment digit, when the transflective liquid crystal display cell is switched off and the emissive display cell is switched on.

2. The digital display device according to claim 1, wherein the transflective liquid crystal display cell is a Twisted Nematic Liquid Crystal Display cell with which are associated a linear polariser disposed above the twisted nematic liquid crystal display cell and a transflective polariser disposed below the twisted nematic liquid crystal display cell.

3. The digital display device according to claim 2, wherein the emissive display cell is an Organic Light-Emitting Diode display cell which emits a red light.

4. The digital display device according to claim 3, comprising, from top to bottom and in this order:
   the first red filter;
   the linear polariser;
   the twisted nematic liquid crystal display cell;
   the transflective polariser;
   the second red filter;
   the organic light-emitting diode display cell.

5. The digital display device according to claim 4, wherein the linear polariser is in direct contact with the first red filter and the twisted nematic liquid crystal display cell, the transflective polariser is in direct contact with the twisted nematic liquid crystal display cell and the second red filter, and the organic light-emitting diode display cell is in direct contact with the second red filter.

6. The digital display device according to claim 3, comprising, from top to bottom and in this order:
- the linear polariser;
- the first red filter;
- the twisted nematic liquid crystal display cell;
- the transflective polariser;
- the second red filter;
- the organic light-emitting diode display cell.

7. The digital display device according to claim 6, wherein the transflective polariser is in direct contact with the twisted nematic liquid crystal display cell and the second red filter and the organic light-emitting diode display cell is in direct contact with the second red filter.

8. The digital display device according to claim 1, wherein the digital display device comprises, from top to bottom, the first red filter, the transflective liquid crystal display cell, the second red filter, the emissive display cell, and a light sensor, wherein the light sensor measures an intensity of an ambient light, said measurement of the intensity of the ambient light being used to accommodate a luminosity of the emissive display cell depending on ambient illumination conditions.

9. The digital display device according to claim 8, wherein an aperture is formed in a completely opaque cathode of the emissive display cell so that the ambient light which penetrates from above in the digital display device can reach the light sensor.

10. The digital display device according to claim 1, wherein the emissive display cell comprises the plurality of juxtaposed light points which are arranged so as to display the at least one second seven-segment digit on a face of the emissive display cell.

11. The digital display device according to claim 1, wherein the emissive display cell comprises the plurality of juxtaposed light points which are arranged so as to form the at least one second seven-segment digit on a face of the emissive display cell.

12. The digital display device according to claim 1, further comprising a push button configured to switch the liquid crystal display cell off and to switch the emissive display cell on.

13. The digital display device according to claim 1, wherein, after a predetermined period of time has elapsed since the transflective liquid crystal display cell is switched off and the emissive display cell is switched on, a microcontroller of the digital display device is configured to control the emissive display cell to switch off and the transflective liquid crystal display cell to switch on.

* * * * *